United States Patent
Iannuzzelli et al.

(10) Patent No.: US 6,884,101 B2
(45) Date of Patent: Apr. 26, 2005

(54) INTERPOSER ONE-STEP LOAD AND SELF-LOCK SOCKET

(75) Inventors: Raymond J. Iannuzzelli, Amherst, NH (US); Daniel L. Callahan, Nashua, NH (US); Philip R. Tousignant, Dracut, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 39 days.

(21) Appl. No.: 09/981,511

(22) Filed: Oct. 17, 2001

(65) Prior Publication Data

US 2003/0073336 A1 Apr. 17, 2003

(51) Int. Cl.$^7$ .............................................. H01R 13/62
(52) U.S. Cl. ........................ 439/330; 439/73; 361/710
(58) Field of Search ................................. 439/330, 331, 439/73; 361/704, 707, 709, 710; 257/718, 719, 726; 174/16.3; 165/80.2, 80.3, 185; 411/522, 523, 524, 530

(56) References Cited

U.S. PATENT DOCUMENTS

| | | | | |
|---|---|---|---|---|
| 4,505,058 A | * | 3/1985 | Peterson | 37/459 |
| 4,993,955 A | * | 2/1991 | Savant | 439/266 |
| 5,195,903 A | * | 3/1993 | Uratsuji | 439/266 |
| 5,318,456 A | * | 6/1994 | Mori | 439/266 |
| 5,462,446 A | * | 10/1995 | Ikeya | 439/264 |
| 5,683,262 A | * | 11/1997 | Matsuoka et al. | 439/266 |
| 5,704,100 A | * | 1/1998 | Swan | 24/656 |
| 5,883,782 A | * | 3/1999 | Thurston et al. | 361/704 |
| 5,917,700 A | * | 6/1999 | Clemens et al. | 361/704 |
| 6,017,226 A | * | 1/2000 | Jeffries et al. | 439/92 |
| 6,043,984 A | * | 3/2000 | Tseng | 361/704 |
| 6,101,093 A | * | 8/2000 | Wong et al. | 361/709 |
| 6,239,974 B1 | * | 5/2001 | Tseng | 361/704 |
| 6,302,719 B1 | * | 10/2001 | Corisis et al. | 439/330 |
| 6,354,856 B1 | * | 3/2002 | Shimada | 439/266 |
| 6,373,703 B1 | * | 4/2002 | Johnson et al. | 361/704 |
| 6,412,546 B1 | * | 7/2002 | Lin et al. | 165/80.3 |
| 6,468,011 B1 | * | 10/2002 | Mayer | 411/353 |

* cited by examiner

Primary Examiner—Gary Paumen
Assistant Examiner—Edwin A. Leon

(57) ABSTRACT

A self-locking interposer restraint mechanism is disclosed. Rather than using screws to compress springs, clips are pushed down over the posts to compress the springs. Once the clips are pushed down to a level at which the springs are sufficiently compressed, the clips engage stops fabricated into the posts thereby locking the restraint mechanism.

23 Claims, 4 Drawing Sheets

INTERPOSER ONE-STEP LOAD AND SELF-LOCK SOCKET

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to electrical sockets used to mount electrical components on a circuit board. More particularly, the present invention relates to interposer sockets and more particularly still to an interposer socket that includes a self-locking feature.

2. Background of the Invention

For many decades, circuit boards, such as those used in computers, have been manufactured by attaching electrical components to the board. In some cases, the components are soldered directly to the board. Although generally satisfactory, soldering a component directly to the board makes it difficult and costly to change that component should it be desired or necessary to replace one component with another. A microprocessor, for example, may have hundreds of connections that, should the processor fail, must be desoldered. A new processor, with its hundred of connections must then be attached to the board. Further, this process must occur without damaging the other components mounted on the circuit board. Even if the processor has not failed, it still might be desired to replace it, for example, when a new and improved version of the processor is made available.

For these and other reasons, "interposer" sockets have become available. Although defined in various ways, an interposer socket is a socket through which a chip (e.g., a microprocessor) is secured to a circuit board without the use of solder. One type of conventional interposer socket arrangement includes four threaded posts on to which various components are disposed such as the circuit board, a heat sink and the like. Springs are then inserted over the posts and held captive by screws connected to the threaded posts. This basic arrangement is illustrated in FIG. 1. An electronic component 10 is "sandwiched" between a heat sink 12 on one side and a base plate 14, circuit board 22 and socket 24 on the other side. Posts 20 extend up through the heat sink and are internally threaded on their upper end 26. Screws 16 compress springs 18 when threaded and tightened into threaded posts 20. The compression of the springs secures the component 10 to the socket 24 and circuit board 22.

The electronic component 10 typically has numerous electrical contacts (referred as "bumps") under the component, which are not specifically shown in FIG. 1. It is generally known that each such contact or bump must have a suitable amount of compressive force (approximately 100 grams) in order to maintain its contact integrity over a 10 year product life. That is, for various reasons, over time substantially less than 100 grams of force per bump may eventually result in an insufficient electrical contact with regard to one or more of the bumps. Such reasons include, for example, "creep" in which a material being compressed naturally gravitates over time toward a certain shape and dimensional thickness. Thus, the amount of creep in the various components shown in FIG. 1 must be considered when determining the initial compressive force from the springs.

Although generally effective, this conventional Interposer socket arrangement does have at least one shortcoming. As the size of the electrical components being retained by such socket increases, the number of bumps increases as well. It is not uncommon today to have a microprocessor package designed for Interposer mounting that has 1443 bumps. Because each bump still must have the predetermined amount of compressive force (e.g., 100 grams per bump), the total amount of compressive force on the chip has become quite large requiring hundreds of pounds of total force. An increase in force can be achieved through the use of stiffer springs 18 (having a larger spring constant). Turning the screws 16 under such large total force occasionally can cause conditions known as galling and/or "cold welding." This condition has to do with the friction between the threads of the screws 16 and the corresponding threads of the posts 20. As the total force increases with the use of stiffer springs, the friction increases and, in a relatively small percentage of cases, actually can cause the screw 16 to become welded to the post 20 preventing the screw from being turned further, preventing sufficient force to be applied to the component and perhaps causing the screw to break. Also, metallic particles can be created when the screws are tightened which can short some of the contacts and cause damage to the chip.

Obviously, these sorts of problems are undesirable. These problems will no doubt become even more severe as chip size grows. Anything that can be done to avoid such problems is highly desirable.

BRIEF SUMMARY OF THE INVENTION

The problems noted above are solved by a self-locking interposer restraint mechanism. Rather than using screws to compress springs, clips are pushed down over the posts to compress the springs. Once the clips are pushed down to a level at which the springs are sufficiently compressed, the clips engage mechanical stops fabricated into the posts.

The clips preferably are made from a single piece of material with members that are pried apart as the clip is pushed down over the post. At a predetermined distance down the length of the post, the post includes a narrow or throat area into which the clip members spring back and engage, thereby holding the clips in place at that location. The posts may have one or more stops if desired.

The configuration of the preferred embodiment permits the socket to simply be "clicked" into place and avoids the complexity and cost associated with tensioning screws by a prescribed amount of torque. Further, the potential for cold welding is also eliminated as the preferred embodiment avoids the use of screws being turned under large amounts of force. These and other aspects of the present invention will become apparent upon studying the following detailed description, figures and claims.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a given component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device "couples" to a second device, that connection may be through a direct electrical connection, or through an indirect electrical connection via other devices and connections. To the extent that any term is not specially defined in this specification, the intent is that the term is to be given its plain and ordinary meaning.

DETAILED DESCRIPTION OF THE PREFERRED EMBODIMENTS

The preferred embodiment of the invention is described below in the context of a processor chip and heat sink combination mounted on a circuit board with an interposer socket. It should be noted, however, that the chip need not be a processor nor is the heat sink required. Broadly, the invention is useful to reduce vibration for any type of component mounted to a circuit board.

Figure 1:
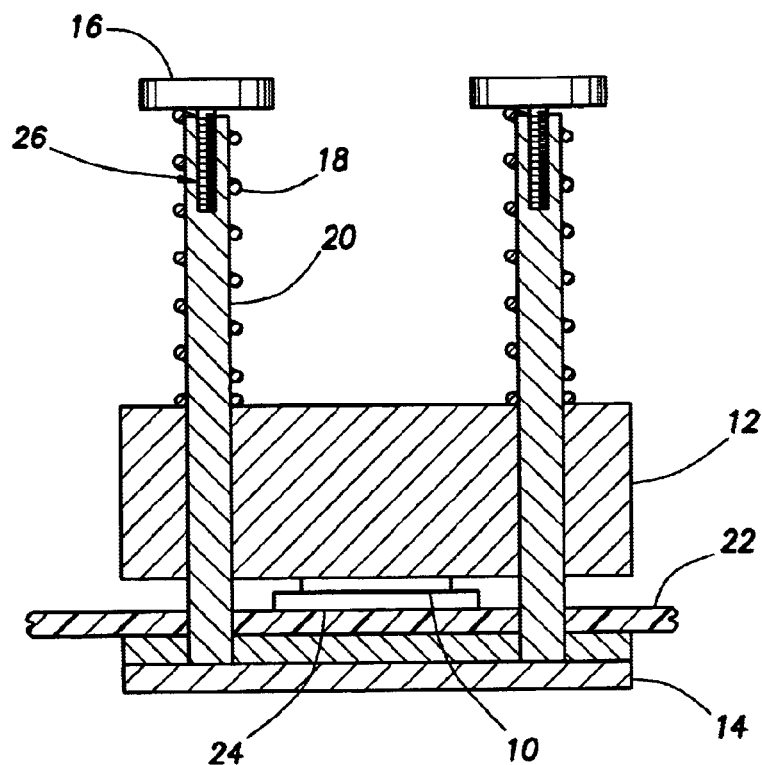
FIG. 1 depicts a prior art interposer socket.
Figure 2:
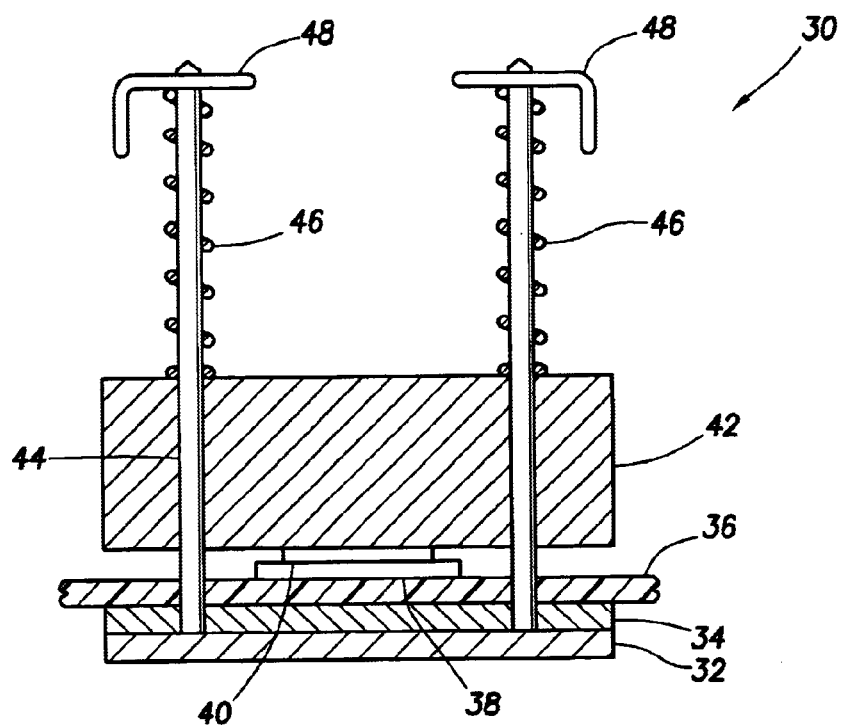
FIG. 2 shows a side view of an electrical component mounted on a circuit board using an interposer socket having a self-locking restraint mechanism in accordance with a preferred embodiment of the invention.

Referring now to FIG. 2, a restraint system 30 is shown to attach a processor 40 and associated heat sink 42 to a circuit board 36. In accordance with the preferred embodiment of the invention, the restraint system 30 includes a backing plate 32 from which a plurality of posts 44 protrude vertically therefrom, an insulator 34 to prevent the backing plate 32 from electrically interfering with the circuit board, an interposer socket 38, springs 46, and clips 48. As shown, the posts 44 protrude upward through corresponding holes in the insulator 34, circuit board 36 and heat sink 42. Springs 46 have an inner diameter sufficiently large to fit down over posts 44 and are held captive by clips 48. In general, the processor 40 is sandwiched in the configuration shown under the compressive force of springs 46. Clips 48 hold the springs 46 under a desired amount of compressive force.

Figure 4:
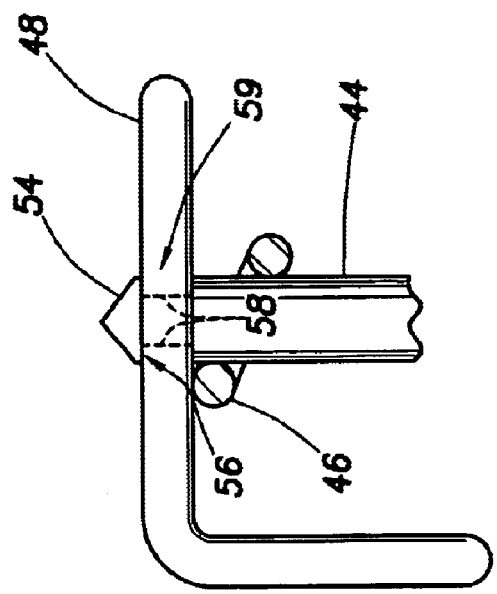
FIG. 4 shows a close-up view of the relationship between the self-locking clip and a post used in the restraint mechanism.
Figure 3:
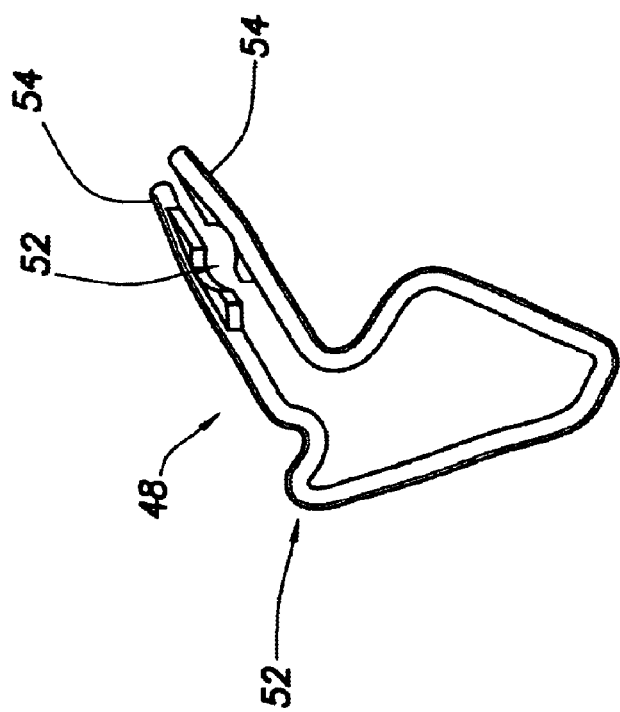
FIG. 3 shows a close-up view of self-locking clip.

A close-up view of a clip 48 is shown in FIG. 3. The clip preferably is made from a single piece of metal such as spring steel or other suitable material. As shown, one end 51 of the clip may be bent downward to prevent it from interfering with other components mounted on circuit board 36 or with proper geometries will limit the rotational movement relative to posts 44 by interference with the heat sink 42. Towards the other end of the clip, a hole 52 is formed between corresponding members 54 of the clip. Because of the construction of the clip and the material from which it is made, clip members 54 are capable of being pushed apart, at least to a certain degree. Then, when such a separating force is removed, the members 54 will return to their initial position as shown in FIG. 3. Referring to FIG. 4, this feature permits the clip to be pushed down over post 44 with hole 52 coinciding with post end 54. The post end 54 is shown in a generally conical shape, although other shapes are acceptable as well. In general, post end 54 comprises a tip that has a cross sectional area that increases from the most distal end of the tip towards surface 56. As the clip is pushed down over post end 54, the post end acts to push clip members apart until the clip engages recessed area 59 defined by post throat 58. Once at the narrower post throat 58, the clip members 54 spring back into their unseparated position. In short, the clip "snaps" into place and the assembly thus is generally referred to as "self-locking." The surface 56 of post end 54 acts as a mechanical "stop" to retain the clip in place around throat 58. The clips thus are referred to as "self-locking clips."

Referring again to FIG. 2, as the clips 48 are pushed down over posts 44, springs 46 are compressed by providing the necessary compressive force to secure the processor 40 in place. This retaining mechanism advantageously does not use screws to compress the springs. Because no screws are used, the problems noted above with regard, for example, to cold welding are avoided. Other benefits will become apparent after reviewing the following discussion.

Figure 5:
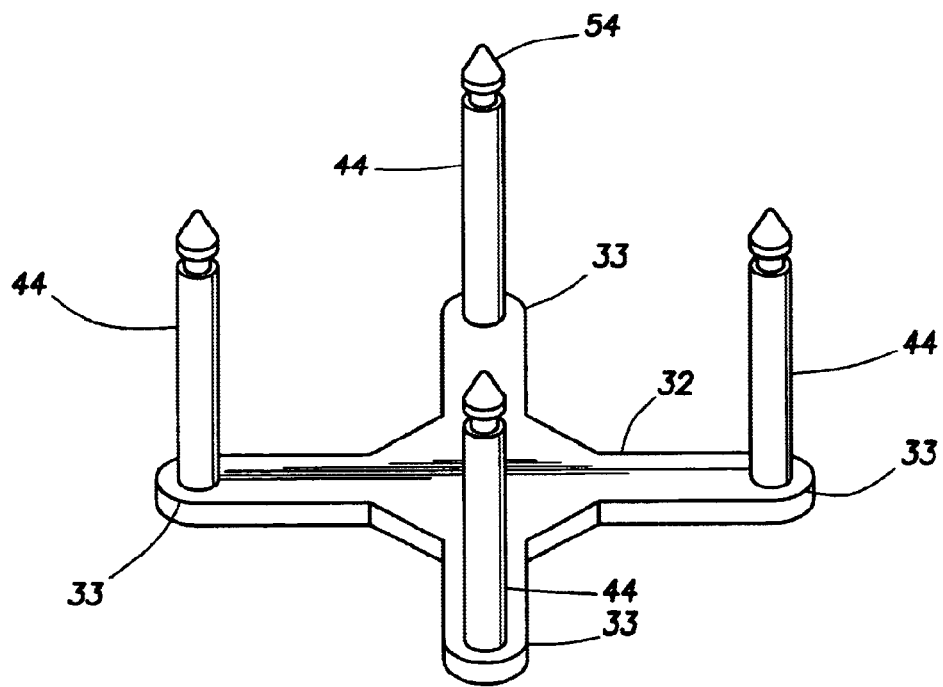
FIG. 5 shows the backing plate of the restraint mechanism with its posts protruding therefrom.

FIG. 5 shows an isolated view of the backing plate 32 with posts 44 protruding therefrom. As shown, there preferably are four posts 44 disposed on distal ends of four backing plate extensions 33. The configuration shown in FIG. 5 is exemplary only and should not be used to limit the scope of the invention or the claims which follow.

Figure 6:
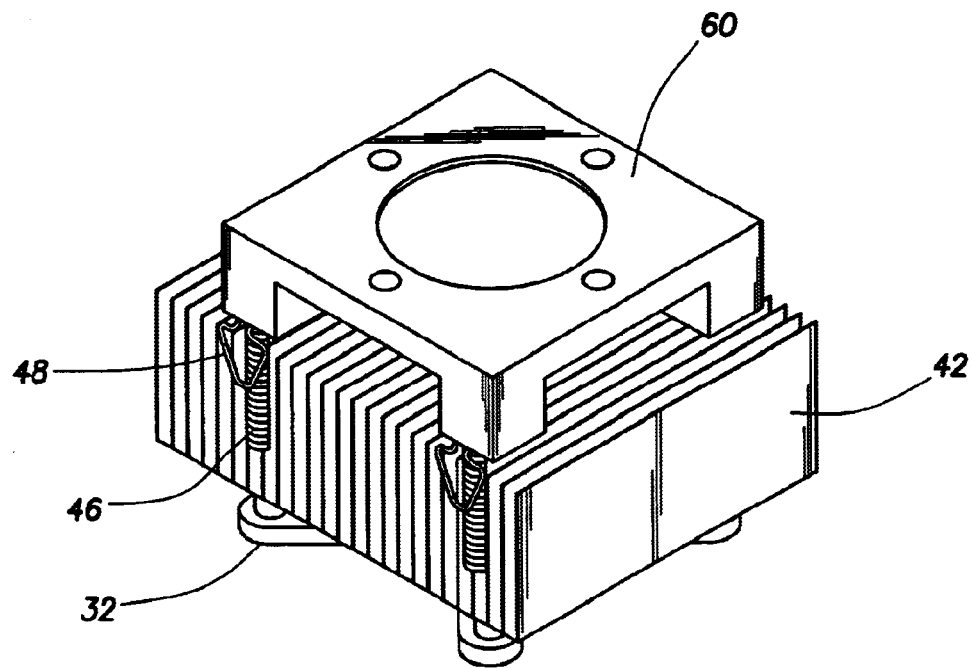
FIG. 6 shows a perspective view of the restraint mechanism.
Figure 7:
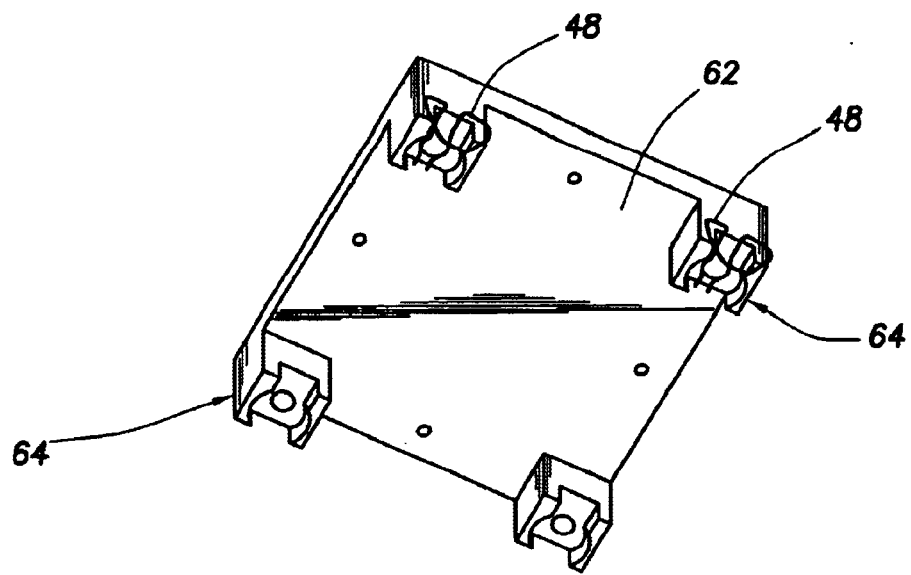
FIG. 7 shows a view of a clip assembly fixture used to assemble in the restraint mechanism.

FIG. 6 shows a perspective view of self-locking mechanism 30 being assembled with a clip assembly plate 60. Clip assembly plate 60 is used to compress springs 46. The underside of the clip assembly plate 60 is shown in FIG. 7 and includes four clip retainer protrusions 64 protruding from a generally flat metal plate. Each protrusion preferably includes a means to hold self-locking clips 48 in place as the assembly plate 60 is pressed down over posts 44. Any suitable tool (e.g., an arbor press) for providing sufficient pressure to plate 60 can be used to engage and lock the restrain mechanism 30. Then, after the self-locking clips 48 have snapped into place on the posts, the assembly plate 60 can be removed and used on other sockets if desired.

Because the springs are compressed and the clips are snapped in place simply by pressing down on the clip assembly plate 60, the processor 40 can be secured in place with the single act of pressing down on the plate. Thus, an additional benefit of the preferred embodiment is that it permits one-step assembly which reduces assembly time and cost, is much simpler, and reduces the amount of precision needed for tensioning the socket compared to conventional interposer arrangements. All that needs to be done is press the assembly plate down until the clips engage their stops. In fact, the amount of force being exerted on the plate need not be monitored. This is in contrast to tightening the screws of conventional interposers as explained above. Such screw-based tensioning generally requires the amount of torque applied to the screws to be carefully monitored to determine when the springs have been sufficiently compressed. Such torque monitoring leads to relatively complex and expensive assembly tools.

Figure 8:
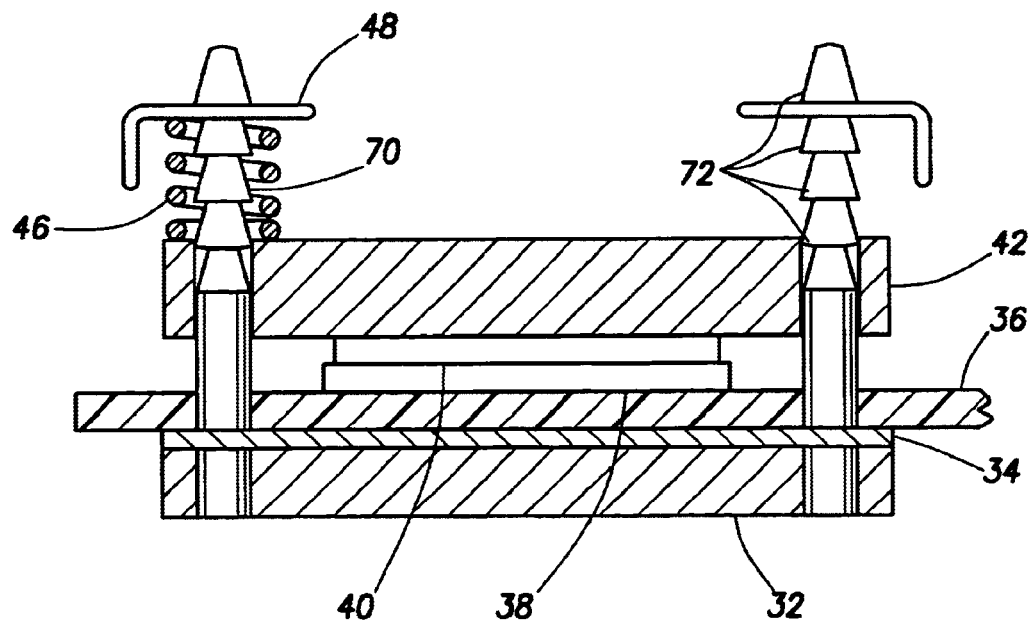
FIG. 8 shows an alternate embodiment of the restraint mechanism using an alternate type of post configuration having a plurality of mechanical stops.

An alternative embodiment of the posts 44 is shown in FIG. 8. As shown, posts 70 include a plurality of extensions 72 each of which can serve to provide a "stop" for the retainer clips 48. Providing multiple stops on the posts advantageously permits the spring to be compressed to varying degrees to provide different compressive forces as desired.

It should be understood that the component restraint mechanism described herein may be used in a computer system that includes a chassis, a system board, an output device (e.g., a display) and an input device (e.g., a mouse or a keyboard).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A component restraint system that is used to secure an electronic component to a circuit board, comprising:
    a backing plate;
    a post extending from said backing plate, said post having a plurality of stop surfaces;
    a spring radially disposed around said post; and
    a clip which, when inserted onto said post, engages the stop surface of said post and compresses said spring, wherein said plurality of stop surfaces permits said spring to be variably compressed.

2. The restraint system of claim 1 further including four posts protruding from said backing plate and including stop surfaces, each post having a clip and a spring disposed thereon.

3. The restraint system of claim 1 wherein said clip includes protruding members which define a hole in which said post is inserted, said protruding members are pushed apart as said clip is pushed along said post towards said stop surface.

4. The restraint system of claim 1 further including a plurality of posts protruding from said backing plate, each post having a clip and a spring disposed thereon.

5. The restraint system of claim 4 wherein each post has an upper end distal from said backing plate and the clip for each post is pushed down over the upper end until the clips engage the stop surfaces of the posts.

6. The restraint system of claim 5 wherein said upper ends of said posts comprise tips formed between the distal end of the post and the stop surfaces, each tip having a smaller cross section at its distal end than at the stop surfaces.

7. The restraint system of claim 5 wherein said upper ends of said posts are substantially conically shaped.

8. The restraint system of claim 5 wherein said electronic component and circuit board are disposed between said backing plate and said springs and, as said springs are compressed by said clips, said electronic component is secured to said circuit board.

9. The restraint system of claim 8 further including heat sink also disposed between said backing plate and said springs, said heat sink further disposed between said electronic component and said springs.

10. An electronic assembly, comprising:
    a circuit board;
    a backing plate;
    a plurality of springs;
    plurality of posts extending from said backing plate through said circuit board and said springs;
    an electronic component and heat sink sandwiched between said circuit board and said springs; and
    a plurality of clips, one clip per post;
    wherein each clip engages one of the posts in one of a plurality of different positions to compress one of said springs to one of a plurality of different compressive forces.

11. The circuit board of claim 10 wherein each clip engages said post in three different positions.

12. The circuit board of claim 10 in which each clip can compress one of said springs to three different positions on said post.

13. A computer system, comprising:
    a processor and heat sink;
    an output device coupled to said processor;
    a circuit board;
    a backing plate;
    a plurality of springs;
    a plurality of posts extending from said backing plate through said circuit board and said springs; and
    a plurality of clips, one clip per post;
    wherein each of said clips has clip members that are pushed apart to engage the posts in a plurality of different positions to variably compress the springs.

14. The computer system of claim 13 wherein in each of said clips, a portion of the clip is bent downward.

15. The computer system of claim 14 wherein said portion of said clip that is bent downward limits the rotational movement of said clip relative to said post.

16. The computer system of claim 13 wherein said clip is fabricated from metal.

17. The computer system of claim 13 wherein upon removal of said clip from said post, said clip members return to an initial position.

18. A method comprising:
    compressing, substantially simultaneously, a plurality of springs that bias an electronic component into an interposer socket; and
    locking, substantially simultaneously, a plurality of clips on a plurality of posts telescoped one each within the plurality of springs, the plurality of clips hold the plurality of springs in compression.

19. The method as defined in claim 18 wherein compressing further comprises pressing an assembly plate, holding the plurality of clips, onto the plurality springs.

20. The method as defined in claim 18 further comprising removing the assembly plate and leaving the plurality of clips locked to the plurality of posts.

21. A system comprising:
    a backing plate defining a plane, the backing plate having a plurality of posts extending substantially perpendicular from the backing plate and each post having a stop surface;
    a circuit board having a plurality of apertures through which the plurality of posts extend;
    an interposer socket on the circuit board within the apertures.
    a plurality of springs radially disposed around each of the plurality of posts;
    a electronic component in operational relationship to the interposer socket and biased toward the interposer socket by the springs;

an assembly plate holding a plurality of clips;

wherein each of the plurality of clips are inserted one each onto the plurality of posts by placing the assembly plate over the plurality of posts and compressing the springs; and wherein the plurality of clips lock one each into the stop surfaces of the posts, holding the springs in compression.

22. The system as defined in claim 21 wherein assembly plate is removed leaving the clips locked to their respective posts.

23. The system as defined in claim 21 further comprising said posts having a plurality of stop surfaces, and wherein the amount of compression of the springs is selectively set by the stop surfaces to which the clip lock.

* * * * *

UNITED STATES PATENT AND TRADEMARK OFFICE
CERTIFICATE OF CORRECTION

PATENT NO. : 6,884,101 B2  Page 1 of 1
APPLICATION NO. : 09/981511
DATED : April 26, 2005
INVENTOR(S) : Raymond J. Iannuzzelli et al.

It is certified that error appears in the above-identified patent and that said Letters Patent is hereby corrected as shown below:

Claim 1, Column 5, line 28, after "engages" delete "the" and insert therefor --a--

Claim 13, Column 6, line 24, after "springs;" delete "and"

Claim 13, Column 6, line 24, after line 24 insert --said processor and heat sink disposed between said circuit board and said springs; and--

Claim 21, Column 6, line 62, after "apertures" delete "." and insert therefor --;--

Claim 23, Column 8, line 7, delete "clip" and insert therefor --clips--

Signed and Sealed this

Twenty-eighth Day of July, 2009

JOHN DOLL
*Acting Director of the United States Patent and Trademark Office*